United States Patent [19]

Hsu

[11] Patent Number: 4,797,721
[45] Date of Patent: Jan. 10, 1989

[54] RADIATION HARDENED SEMICONDUCTOR DEVICE AND METHOD OF MAKING THE SAME

[75] Inventor: Sheng T. Hsu, West Windsor Township, Mercer County, N.J.

[73] Assignee: General Electric Company, Schenectady, N.Y.

[21] Appl. No.: 37,482

[22] Filed: Apr. 13, 1987

[51] Int. Cl.[4] .................... H01L 27/12; H01L 29/78
[52] U.S. Cl. .................... 357/23.7; 357/23.12; 357/42
[58] Field of Search ............ 357/23.7, 23.4, 23.3, 357/23.12, 42

[56] References Cited

U.S. PATENT DOCUMENTS

| | | | |
|---|---|---|---|
| 4,106,045 | 8/1978 | Nishi | 357/23.7 |
| 4,183,134 | 1/1980 | Oehler et al. | 29/571 |
| 4,199,773 | 4/1980 | Goodman et al. | 357/23.7 |
| 4,393,578 | 7/1983 | Cady et al. | 29/576 |
| 4,463,492 | 8/1984 | Maeguchi | 29/576 |
| 4,509,990 | 4/1985 | Vasudev | 148/1.5 |

FOREIGN PATENT DOCUMENTS

| | | | |
|---|---|---|---|
| 55-18052 | 5/1980 | Japan | 357/23.7 |
| 55-61069 | 5/1980 | Japan | 357/23.7 |
| 55-710068 | 5/1980 | Japan | 357/23.7 |
| 56-91473 | 7/1981 | Japan | 357/23.7 |
| 57-190362 | 11/1982 | Japan | 357/23.7 |

*Primary Examiner*—William D. Larkins
*Attorney, Agent, or Firm*—Henry I. Steckler; James C. Davis, Jr.; Paul R. Webb, II

[57] ABSTRACT

An N-channel transistor formed in a layer of semiconductor material disposed on a insulating substrate is disclosed. The source region has a depth less than the thickness of the semiconductor layer so that a P-type region can be formed in the semiconductor layer between the source region and the insulating substrate. This P-type region has an impurity concentration sufficient to prevent the depletion region of the source from extending to the interface between the layer of semiconductor material and the substrate. The P-type region substantially prevents back-channel leakage currents from flowing between the source region and the drain region along the portion of the layer of semiconductor material immediately adjacent the insulating substrate when the device has been irradiated.

13 Claims, 2 Drawing Sheets

RADIATION HARDENED SEMICONDUCTOR DEVICE AND METHOD OF MAKING THE SAME

This invention relates to a semiconductor device which includes a layer of semiconductor material disposed on an insulating substrate and a method of making the same. More particularly, the present invention relates to a MOS/SOI device with suppressed radiation induced back-channel leakage.

BACKGROUND OF THE INVENTION

Semiconductor devices having a layer of semiconductor material disposed on an insulating substrate are generally known in the art. An example of such a device is a silicon-on-insulator (SOI) semiconductor device which includes a silicon island formed On the surface of an insulating material. When the insulating material is a sapphire substrate, the structure is known as a silicon-on-sapphire (SOS) semiconductor device. Metal-oxide-semiconductor (MOS) transistors or other active devices are formed in and on the silicon island. MOS/SOI transistors generally have higher speed and improved radiation hardness in comparison with MOS transistors formed in bulk silicon.

MOS/SOI transistors are conventionally fabricated by first forming an island of semiconductor material, such as single-crystalline silicon, on the surface of an insulating substrate, such as sapphire. The silicon island is generally doped to have a first conductivity type. A gate oxide layer and a gate electrode are then formed on the island. Source and drain regions of a second conductivity type ae formed in the silicon island using conventional ion implantation techniques. During the implantation step, the gate electrode acts as a masking layer so that self-aligned source and drain regions are formed in the silicon island. Then, the device is completed using conventional MOS processing techniques.

MOS/SOI transistors have a higher degree of radiation hardness with respect to transient-type radiations (gamma pulses, x-ray pulses and high-energy single particles) because, when compared to bulk silicon devices, there is a smaller volume of silicon present in which photocurrent generation can occur. However, these devices often suffer from back-channel leakage. The back-channel leakage problem can best be illustrated by viewing FIG. 1. In FIG. 1, an N-channel SOS transistor 10 is shown having a sapphire substrate 12 and a silicon island 14. The silicon island 14 contains N-type source and drain regions 16 and 20, respectively, separated by a P-type region 18. A gate oxide layer 22 and a gate electrode 24 are disposed over the silicon island 14. When this device is exposed to any type of high-energy radiation, radiation induced positive charges 26 accumulate in the sapphire substrate 12 in the region adjacent the silicon island/sapphire substrate interface. The positive charges 26 attract corresponding negative charges 28 in the P-type region 18 of the silicon island 14. This accumulation of negative charges 28 creates a back-channel or electron flow between the source region 16 and the drain region 20 which is not controlled by the gate electrode 24.

Numerous solutions have been proposed to reduce back-channel leakage currents. For example, P. Vasudev in U.S. Pat. No. 4,509,990, entitled "Solid Phase Epitaxy And Regrowth Process With Controlled Defect Density Profiling For Heteroepitaxial Semiconductor On Insulator Composite Substrates," issued Apr. 9, 1985, discloses the use of a high defect density layer within the silicon island. This high defect density layer, which may be a residual damaged interface layer or an annealed interface layer, is formed during the ion implantation step used in the solid-phase epitaxy growth process. The high defect density layer is positioned in the silicon island adjacent to the silicon/sapphire interface. This high defect density layer reduces the leakage currents along the back-channel because the damaged crystal structure reduces the mobility of the charge carriers along this region.

Back-channel leakage currents can also be reduced by selectively doping portions of the silicon island. U.S. Pat. No. 4,183,134, entitled "High Yield Processing For Silicon-On-Sapphire CMOS Integrated Circuits," issued Jan. 15, 1980, to H. Oehler et al. is an example of such a process. In N-channel devices, P-type materials are implanted into the back-channel region adjacent the silicon/sapphire interface. This region near the silicon/sapphire interface has a heavier P-type doping concentration so as to increase the amount of radiation-induced positive charge within the sapphire substrate needed before the back-channel in the silicon island is turned on.

Because of the large density of defects in the single-crystalline silicon material near the interface with the insulating substrate, it is difficult to heavily dope the back-channel region such that the implanted ions are electrically active. The silicon grain boundaries near the silicon island/insulating substrate interface also render many of the implanted P-type dopant ions electrically inactive. Also, if the straggle of the implanted P-type ions becomes too large, the threshold voltage of the N-channel transistor may be affected by the back-channel doping step. Therefore, new techniques are needed for suppressing radiation induced back-channel leakage currents.

SUMMARY OF THE INVENTION

The semiconductor device of the present invention includes source and drain regions formed in a layer of semiconductor material which is disposed on an insulating substrate. The layer of semiconductor material has a first conductivity type; whereas, the source and drain regions have a second conductivity type. The device is constructed such that at least one of the source and drain regions have a depth which is less than the thickness of the layer of semiconductor material. A means is disposed in this layer of semiconductor material between at least one of the source and drain regions having a depth which is less than the thickness of the layer of semiconductor material and the insulating substrate for preventing the depletion region of at least one of the source and drain regions having a depth which is less than the thickness of the layer of semiconductor material from extending to the interface between the layer of semiconductor material and the insulating substrate. This means substantially prevents back-channel leakage currents from flowing along the portion of the layer of semiconductor material immediately adjacent the interface with the insulating substrate. The present invention also includes a method of fabricating the semiconductor device described above.

DETAILED DESCRIPTION OF THE PREFERRED EMBODIMENT

Figure 1:
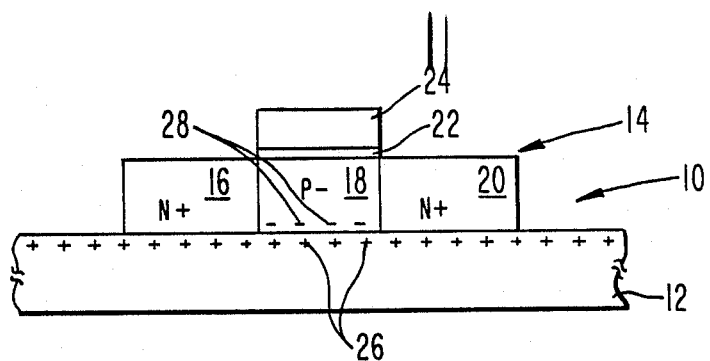
FIG. 1 is a cross-sectional view of an N-channel SOS device illustrating the back-channel leakage problem.
Figure 2:
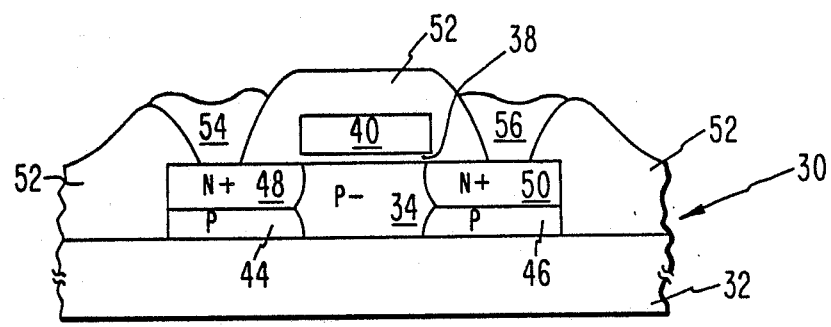
FIG. 2 is a cross-sectional view of the semiconductor device of the present invention.

The present invention will be described using single-crystalline silicon as a semiconductor material which is disposed on an insulating substrate of single-crystalline sapphire. However, it should be understood that other conventional semiconductor materials, such as IIb-VIa and IIIa-Va semiconductor compounds, may be substituted for silicon. Additionally, other conventional insulator substrates, such as spinel, beryllium oxide, and silicon dioxide disposed on a semiconductor material, may be substituted for sapphire. Referring to FIG. 2, the semiconductor device of the present invention is generally designated as 30. A lightly doped P-type single-crystalline silicon island 34 is disposed on a sapphire substrate 32.

The N-channel transistor of the present invention also includes a gate insulating layer 38, such as silicon dioxide, which is disposed on the silicon island 34. A gate electrode 40, such as N-type polycrystalline silicon, is formed over the gate insulating layer 38. First and second P-type separated regions 44 and 46, respectively, are disposed in the lightly doped P-type silicon island 34. The first and second P-type separated regions 44 and 46, respectively, have an impurity concentration of about two to three orders of magnitude greater than the P-type impurity concentration of the silicon island 34. Preferably, the first and second separated regions 44 and 46, respectively, each have a P-type impurity concentration of about $10^{19}$ to $10^{20}$ cm$^{-3}$, while the lightly doped P-type silicon island 34 has an impurity concentration of about $10^{16}$ to $10^{17}$ cm$^{-3}$.

FIG. 2 also illustrates that heavily doped N-type source and drain regions 48 and 50, respectively, are disposed above the respective first 44 and second 46 P-type separated regions. The first and second separated regions 44 and 46, respectively, are separated by a distance which is at least equal to the length of the channel region between the heavily doped source and drain regions 48 and 50, respectively. The first and second separated regions 44 and 46, respectively, also subtend the respective source 48 and drain 50 regions.

The N-type source region 48 and the first P-type region 44 form a P/N junction. If the depletion region of the source region 48 extends to the interface between the silicon island 34 and the sapphire substrate 32, current will flow between the source 48 and drain 50 regions when the back-channel is turned on. In the present invention, however, the impurity concentration of the first P-type region 44 is sufficient to prevent, during the operation of the device, the depletion region of the source region 48 from extending to the interface between the silicon island 34 and the sapphire substrate 32. This substantially prevents radiation-induced leakage currents from flowing along the back-channel between the source region 48 and drain region 50.

A dielectric material 52, such as phosphosilicate glass (PSG) or borophosphosilicate glass (BPSG), is provided over the device 30. Additionally, source and drain contacts 54 and 56, respectively, are provided in openings formed in the dielectric layer 52.

Figure 3:
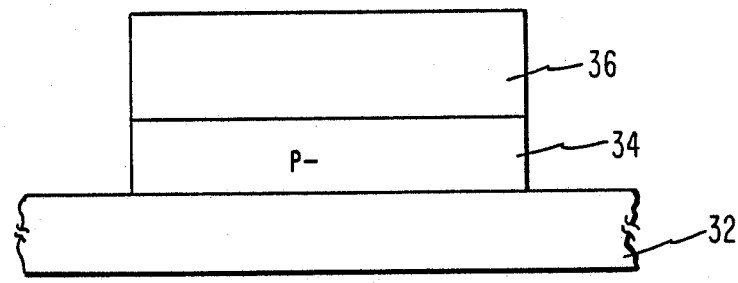
FIGS. 3 to 6 are cross-sectional views illustrating the various steps of the method of the present invention for fabricating the semiconductor device shown in FIG. 2.

The method for fabricating the semiconductor device shown in FIG. 2 is illustrated by FIGS. 3 to 6. Referring now to FIG. 3, the method begins with a sapphire substrate 32 upon which a continuous layer of lightly doped P-type single-crystalline silicon (not shown), having an impurity concentration of about $10^{16}$ to $10^{17}$ cm$^{-3}$, is grown using conventional heteroepitaxial deposition techniques. A layer of photoresist is deposited and patterned so as to form a first masking layer 36. Then, the portions of the continuous layer of P-type single-crystalline silicon (not shown) not subtended by the first masking layer 36 are removed using conventional plasma or wet etching techniques. This etching step defines the silicon island 34 shown in FIG. 3. The first masking layer 36 is then removed using a conventional solvent.

The lightly doped P-type single-crystalline silicon island 34 can also be formed by first depositing a continuous layer of intrinsic single-crystalline silicon on the sapphire substrate 32. The silicon island is defined using the etching techniques described above. The intrinsic silicon island is then ion implanted with the appropriate P-type dopants so as to produce the lightly doped P-type single-crystalline silicon island 34 having an impurity concentration of about $10^{16}$ to $10^{17}$ cm$^{-3}$. The silicon island 34 is then heated to a temperature of about 850° C. to redistribute the implanted ions so that the impurity concentration is approximately uniform across the entire thickness of island. The silicon island 34 produced by either of these techniques has a thickness in the range of about 0.4-0.5 micrometer.

Figure 4:
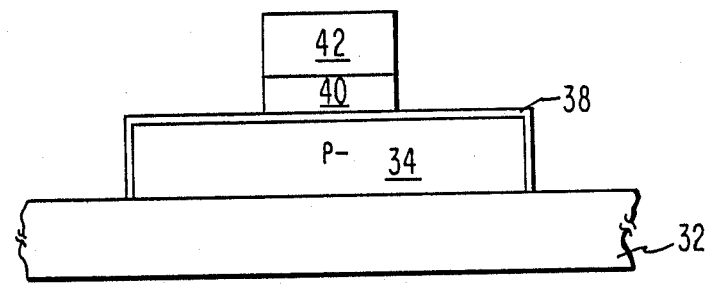

After the P-type silicon island 34 has been defined, the gate insulating layer 38 shown in FIG. 4 is formed. The gate insulating layer 38 is typically a layer of silicon dioxide which is formed by heating the silicon island 34 in an oxidizing atmosphere to a temperature of about 850° C. An N-type polycrystalline silicon layer (not shown) is then formed over the silicon island 34. A second photoresist layer is deposited and patterned so as to only cover the portion of the N-type polycrystalline silicon layer which is to be used as the gate electrode. This patterned second photoresist layer forms a second masking layer 42. The portions of the N-type polycrystalline silicon layer (not shown) not subtended by the second masking layer 42 are removed using conventional etching techniques so as to define the gate electrode 40.

Figure 5:
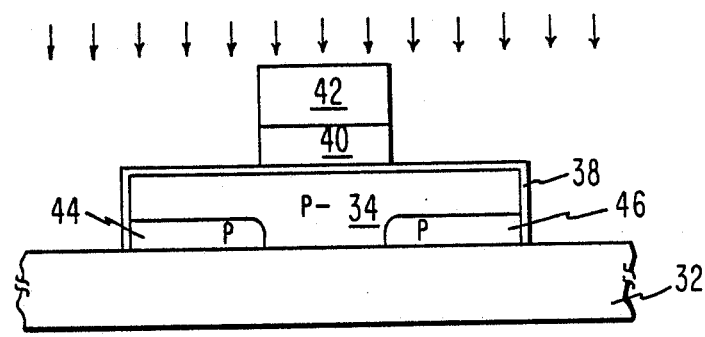

The structure formed in FIG. 4 is then implanted with P-type dopants, such as boron, in the manner shown in FIG. 5. Boron is introduced into the silicon island 34 using an energy in the range of about 150–180 keV and a dosage in the range of about $5 \times 10^{14}$–$2 \times 10^{15}$ cm$^{-2}$ to form the first and second P-type separated regions 44 and 46, respectively. The second masking layer 42 remains over the gate area to prevent any of the high energy boron ions from penetrating the gate electrode 40 and damaging the underlying portion of the gate insulating layer 38. The first and second P-type separated regions 44 and 46, respectively, are also self-aligned relative to the gate electrode 40 and disposed below the top surface of the silicon island 34.

The doping step used to form the first and second P-type separated regions 44 and 46, respectively, is sigficantly different from the doping step used in the prior art to form a heavily doped back-channel. In the present invention, the P-type dopants used to form the first and second separated regions 44 and 46, respectively, do not pass through the channel region under the gate electrode 40. Thus, the threshold voltage of the transistor is not affected by the straggle of the P-type ions.

The second masking layer 42 may be removed immediately after the doping step illustrated in FIG. 5 using a conventional solvent or it may be removed later in the process after the step illustrated in FIG. 6. If the implant energies are not sufficent to cause the boron ions to penetrate the gate electrode 40 and damage the gate insulating layer 38, then the second masking layer 42 may be removed after the gate electrode 40 has been defined, such as after the step illustrated in FIG. 4.

Figure 6:
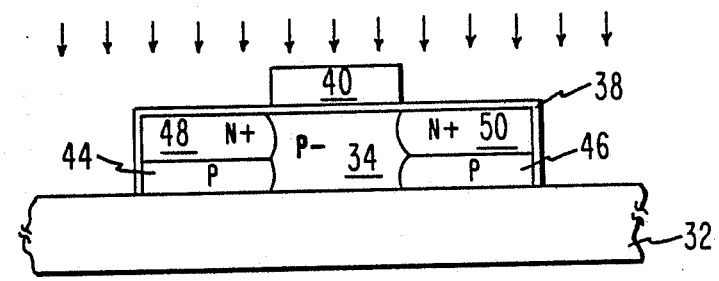

Now referring to FIG. 6, heavily doped N-type source and drain regions 48 and 50, respectively, are formed by implanting N-type dopants into the portions of the silicon island 38 above the first and second P-type separated regions 44 and 46, respectively. Arsenic is typically implanted at an energy in the range of about 40-150 keV using a dosage in the range of about $1 \times 10^{15}$-$4 \times 10^{15}$ cm$^{-2}$. Since the gate electrode 40 acts as a masking layer, the source and drain regions 48 and 50, respectively, are self-aligned. The source and drain regions 48 and 50, respectively, each have an N-type impurity concentration of about $10^{-3}$.

After the N-type dopant implantation step, a dielectric layer, such as PSG or BPSG, is deposited using conventional techniques to a thickness of about 0.4–0.5 micrometer. Openings are then formed in a dielectrical layer so that contacts 54 and 56, shown in FIG. 2, can be made to the respective source 48 and drain 50 regions.

Although the process illustrated in FIGS. 3 to 6 carries out the P-type doping step for the first and second separated regions 44 and 46, respectively, before the N-type doping step for the source and drain regions 48 and 50, respectively, the step illustrated in FIG. 6 can b carried out before the step illustrated in FIG. 5. When using this alternative sequence, the second masking layer 42 remains over the gate electrode 40 until at least after the P-type doping step used to form the first and second separated regions 44 and 46, respectively, is carried out.

A further embodiment of the present invention includes an N-channel SOS device where the P-type separated region is disposed under either the source region 48 or the drain region 50. The process illustrated in FIGS. 3 to 6 would be modified by masking the area over either the source region 48 or drain region 50 during the P-type doping step illustrated in FIG. 5 so that only a single P-type region is formed in the silicon island 34. The source region 48 or drain region 50 which does not overlie the single P-type region would then be formed so that it extends to the interface between the silicon island 34 and the sapphire substrate 32. It is preferable to form the P-type region under at least the source region because the drain bias is usually higher than the source bias. When the drain bias is high, the P-type doping concentration necessary to prevent the depletion region of the drain from extending to the interface also becomes quite high.

As an additional embodiment of the present invention, the method shown in FIGS. 2 to 6 can be easily adapted to form a complementary metal-oxide-semiconductor (CMOS) integrated circuit which is disposed on an insulating substrate. For example, islands for the N-channel and P-channel transistors would be formed on an insulating substrate using the technique illustrated in FIG. 3. A gate insulating layer and a gate material would also be formed over the islands. Then, a masking layer, such as $Si_3N_4$, would be deposited and patterned so that it overlies the regions of the gate material where the gate electrodes are to be located. The gate electrode would then be defined using conventional etching techniques. The $Si_3N_4$ mask remains over the gate electrodes during the implantation steps to protect the gate insulating layer in the same way as the masking layer 42 shown in FIG. 5.

The island used to form the P-channel transistor would be masked with a photoresist layer during the implantation steps used to form both the first and second P-type separated regions and the heavily doped source and drain regions in the N-channel island. The photoresist layer over the P-channel transistor island would then be removed. While masking the N-channel island, the island used to form the P-channel transistor would then be doped with the appropriate dopants to form the source and drain regions. The $Si_3N_4$ masks are removed and the device is completed using conventional CMOS processing techniques.

I claim:

1. A semiconductor device, comprising:
   an insulating substrate,
   a layer of semiconductor material of a first conductivity type disposed on said insulating substrate;
   a gate insulating layer disposed over said layer of semiconductor material;
   a gate electrode disposed over said gate insulating layer;
   source and drain regions of a second conductivity type disposed in said layer of semiconductor material, said source and drain regions having a depth less than the thickness of said layer of semiconductor material;
   a first region of a first conductivity type having an impurity concentration greater than the impurity concentration of said layer of semiconductor material disposed in said layer of semiconductor material between said source region and said substrate and subtending said source region; and
   a second region of a first conductivity type having an impurity concentration greater than the impurity concentration of said layer of semiconductor material disposed in said layer of semiconductor material between said drain region and said substrate and subtending said drain region.

2. A semiconductor device according to claim 1 wherein said layer of semiconductor material is an island of single-crystalline silicon and said first and second conductivity types are P-type and N-type respectively.

3. A semiconductor device according to claim 2 wherein said first region has a P-type impurity concentration of at least two orders of magnitude greater than the P-type impurity concentration of said layer of semiconductor material.

4. A semiconductor device according to claim 2 wherein said first region has a P-type impurity concentration sufficient to prevent the depletion region of said source from extending to the interface between said layer of semiconductor material and said substrate.

5. A semiconductor device according to claim 2 wherein said first and second regions have substantially the same P-type impurity concentration.

6. A semiconductor device according to claim 2 wherein said source and drain regions are self-aligned relative to said gate electrode.

7. A semiconductor device according to claim 2 wherein said first and second regions are separated by a distance which is at least equal to the distance between said source and drain regions.

8. A semiconductor device, comprising:
an insulating substrate,
a layer of semiconductor material of a first conductivity type disposed on said insulating substrate;
a gate insulating layer disposed over said layer of semiconductor material;
a gate electrode disposed over said gate insulating layer;
source and drain regions of a second conductivity type disposed in said layer of semiconductor material, said source and drain regions having a depth less than the thickness of said layer of semiconductor material;
a first region of a first conductivity type having an impurity concentration greater than the impurity concentration of said layer of semiconductor material disposed in said layer of semiconductor material between said source region and said substrate; and
a second region of a frst conductivity type having an impurity concentration greater than the impurity concentration of said layer of semiconductor material disposed in said layer of semiconductor material between said drain region and said substrate;
wherein said first and second regions are separated by a distance which is at least equal to the distance between said source and drain regions.

9. A semiconductor device according to claim 8 wherein said layer of semiconductor material is an island of single-crystalline silicon and said first and second conductivity types are P-type and N-type respectively.

10. A semiconductor device according to claim 9 wherein said first region has a P-type impurity concentration of at least two orders of magnitude greater than the P-type impurity concentration of said layer of semiconductor material.

11. A semiconductor device according to claim 9 wherein said first region has a P-type impurity concentration sufficient to prevent the depletion region of said source from extending to the interface between said layer of semiconductor material and said substrate.

12. A semiconductor device according to claim 9 wherein said first and second regions have substantially the same P-type impurity concentration.

13. A semiconductor device according to claim 9 wherein said source and drain regions are self-aligned relative to said gate electrode.

* * * * *